United States Patent
Liaw

(10) Patent No.: US 7,254,052 B2
(45) Date of Patent: Aug. 7, 2007

(54) MEMORY CIRCUIT AND METHOD FOR READING OUT A MEMORY DATUM FROM SUCH A MEMORY CIRCUIT

(75) Inventor: Corvin Liaw, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/287,501

(22) Filed: Nov. 25, 2005

(65) Prior Publication Data

US 2006/0126413 A1    Jun. 15, 2006

(51) Int. Cl.
*G11C 7/00*    (2006.01)
(52) U.S. Cl. .................................. 365/148; 365/158
(58) Field of Classification Search ............... 365/148, 365/158, 207
See application file for complete search history.

(56) References Cited

U.S. PATENT DOCUMENTS

| 6,512,688 | B2 * | 1/2003 | Thewes et al. | ............. 365/158 |
| 6,873,538 | B2 * | 3/2005 | Hush | ............. 365/148 |
| 2006/0067147 | A1 * | 3/2006 | Roehr | ............. 365/207 |

OTHER PUBLICATIONS

Sakamoto, T., Kaeriyama, S., Sunamura, H., Mizuno, M., Kawaura, H., Hasegawa, T., Terabe, K., Nakayama, T., and Aono, M., "A Nonvolatile Programmable Solid Electrolyte Nanometer Switch", IEEE Journal of Solid-State Circuits, vol. 40, Issue 1, Jan. 2005 pp. 168-176, originally published in Solid-State Circuits Conference, 2004. Digest of Technical Papers. ISSCC. 2004 IEEE International, Feb. 15-19, 2004.
Kennedy, E.J. and Wait, J.V., "Chapter 27: Operational Amplifiers", The Electrical Engineering Handbook, Ed. Richard C. Dorf, Boca Raton: CRC Press LLC, 2000.

* cited by examiner

*Primary Examiner*—Vu A. Le
(74) *Attorney, Agent, or Firm*—Patterson & Sheridan, L.L.P.

(57) ABSTRACT

The present invention relates to a memory circuit comprising a CBRAM resistance memory cell, which is connected to a bit line and a word line and has a CBRAM resistance element, the resistance of which can be set by means of a write current, in order to store an item of information, and which has a selection switch, which can be driven via the word line, in order to connect a first potential to the bit line via the CBRAM resistance element; a reference resistance cell, which is connected to the bit line and to a reference line and has a reference resistance element, the resistance of which is set to a resistance threshold value, and a reference selection switch, which can be driven via the reference line, in order to connect a second potential to the bit line via the reference resistance element; a read-out unit, which is configured to activate the reference selection switch and the selection switch for the purpose of reading out a memory datum, so that a memory cell current flows via the CBRAM resistance memory cell and a reference current flows via the reference resistance cell onto the bit line; and an evaluation unit, which is connected to the bit line, and which outputs the memory datum in a manner dependent on a resulting electrical quantity assigned to the bit line.

22 Claims, 3 Drawing Sheets

MEMORY CIRCUIT AND METHOD FOR READING OUT A MEMORY DATUM FROM SUCH A MEMORY CIRCUIT

CROSS-REFERENCE TO RELATED APPLICATIONS

This application claims foreign priority benefits under 35 U.S.C. §119 to co-pending German patent application number DE 10 2004 056 911.8, filed 25 Nov. 2004. This related patent application is herein incorporated by reference in its entirety.

BACKGROUND OF THE INVENTION

1. Field of the Invention

The invention relates to a memory circuit having resistance memory cells, in particular having conductive bridging random access memory (CBRAM) resistance memory cells. The invention furthermore relates to a method for reading out a memory datum from such a memory circuit.

2. Description of the Related Art

By way of example, memory circuits may have resistance elements as memory cells, the respective resistance value of which resistance elements may be different depending on the information to be stored. In this case, the resistance elements are arranged in a matrix of word lines and bit lines as is generally customary in memory circuits, and the information is determined by applying a voltage to the word line and measuring the resulting current on the bit line. The bit line current determined is compared with a reference value, and the value of the stored datum is determined in accordance with the result of the comparison. Reference resistance elements are usually provided for this purpose, the resistance value of said elements corresponding to a resistance threshold value, whereby a limit between two states to be stored is defined.

Customary resistance elements include CBRAM resistance elements having a solid electrolyte, for which different resistance values may be set by applying a write current in the CBRAM resistance element. Resistance elements of this type are also referred to as PMC resistance elements (programmable metalization cell) in the literature. Such elements, as already described, are preferably read by applying a voltage across the CBRAM resistance element and by determining the resulting current through the CBRAM resistance element with a voltage drop that is kept constant. For comparison with a reference value, provision is made of a reference resistance element having a resistance threshold value. A sense amplifier circuit is preferably provided for the reference resistance element, the sense amplifier circuit being identical to the sense amplifier circuits for the CBRAM resistance elements. The corresponding output quantities of the sense amplifier circuit for the reference resistance element and the CBRAM resistance element are compared with one another. Since one or more reference resistance elements are essentially provided for each bit line present, there is a considerable additional outlay on circuitry in order to generate the comparison quantity dependent on the resistance threshold value of the reference resistance element and to compare it with the electrical quantity dependent on the memory datum stored in the CBRAM memory cell. In addition, various electrical parameters of the respective sense amplifier circuit for the CBRAM memory cells and for the reference resistance elements influence the corresponding electrical quantities, such as, for example, the parameter of the offset of an operational amplifier used in the sense amplifier circuit. The separation between the resistance values for the individual states of the memory datum that are to be stored therefore has to be chosen to have a sufficiently large magnitude.

SUMMARY OF THE INVENTION

Therefore, it is an object of the present invention to provide a memory circuit having a CBRAM resistance memory cell in which the outlay on circuitry for reading out a memory datum is reduced and in which the read-out sensitivity is increased compared with previous memory circuits. It is furthermore an object of the present invention to provide a method for evaluating a stored memory datum in a CBRAM resistance memory cell arranged on a bit line.

A first aspect of the present invention provides a memory circuit. The memory circuit comprises a CBRAM resistance memory cell, which is connected to a bit line and a word line and has a CBRAM resistance memory element, the resistance of which can be set by means of a write current, in order to store an item of information, and has a selection switch, which can be driven via the word line, in order to connect a first potential to the bit line via the CBRAM resistance element. Furthermore, provision is made of a reference resistance cell, which is connected to the bit line and to a reference line and has a reference resistance element, the resistance of which is fixedly set to a resistance threshold value, and a reference selection switch, which can be driven via the reference line, in order to connect a second potential to the bit line via the reference resistance element. A read-out unit is provided such that the reference selection switch and the selection switch are activated for the purpose of reading out a memory datum, so that a memory cell current flows via the CBRAM resistance memory cell and a reference current flows via the reference resistance cell onto the bit line. With the aid of an evaluation unit connected to the bit line, the memory datum is output in a manner dependent on a resulting electrical quantity assigned to the bit line.

The memory circuit according to the invention thus provides for connecting the reference resistance cell and the CBRAM resistance memory cell to be read to the same bit line for the purpose of read-out, so that a resulting electrical quantity which represents the memory datum to be read out can be detected on the bit line. The resulting electrical quantity essentially depends on whether the resistance value of the CBRAM resistance memory cell to be read is above or below the resistance threshold value predetermined by the reference resistance cell. That is to say that depending on whether the resistance value of the CBRAM resistance memory cell is greater or less than the resistance threshold value of the reference resistance cell, a first state or a second state is read out from the CBRAM resistance memory cell. The advantage of the memory circuit according to the invention is that the evaluation and read-out of the reference resistance cell do not require a dedicated evaluation unit which provides a corresponding electrical quantity for comparison with an electrical quantity resulting from the read-out of the CBRAM resistance memory cell. Furthermore, the read-out accuracy can be improved since the evaluation inaccuracies are not impaired on account of two different evaluation units for a CBRAM resistance memory cell to be read and the assigned reference resistance cell.

It may be provided that, given a potential that is kept constant on the bit line with the reference selection switch activated and the selection switch activated, the evaluation unit receives a current resulting from the memory cell current and reference current and outputs the memory datum in a manner dependent on the resulting current. The memory datum is specified by the value of the resulting current in this way.

The evaluation unit preferably has an operational amplifier having an input connected to the bit line, a negative feedback circuit being provided in order to keep the potential on the bit line constant at a predetermined potential value.

Provision may furthermore be made of a first voltage source for providing a first potential and a second voltage source for providing the second potential, the first and second potentials having different signs with regard to the predetermined potential value of the bit line. In this way, the memory datum can essentially be deduced from the sign of the current flowing from or onto the bit line.

In accordance with a further embodiment of the invention, provision is made of a plurality of reference resistance cells having different resistance threshold values which are connected to the bit line. The sense amplifier, in the event of read-out, successively activates a respective one of the reference resistance cells and the CBRAM resistance memory cell to be read, and the evaluation unit outputs the memory datum in a manner dependent on the resulting currents on the bit line. In this way, it is possible to realize a memory circuit in which more than one item of binary information can be stored in a memory cell by virtue of a plurality of resistance ranges being defined which are assigned different states stored in the CBRAM resistance element. As a result of the provision of a plurality of reference resistance cells, the range in which the resistance value of the CBRAM resistance memory cell to be read is situated can be progressively determined and the corresponding memory datum can be assigned.

In accordance with a further embodiment of the present invention, the read-out unit is configured such that the reference selection switch and the selection switch are activated successively or simultaneously for a predetermined time duration in each case, so that depending on the resistance of the CBRAM resistance element and the resistance of the reference resistance element after the deactivation of the reference selection switch and of the selection switch there is a resulting charge on the bit line. The evaluation unit is configured such that it outputs the memory datum in a manner dependent on the resulting charge on the bit line. This constitutes a further possibility for determining a resulting electrical quantity if both the reference resistance cell and the CBRAM resistance memory cell are directly connected to the bit line.

A charge equalizing unit may furthermore be connected to the bit line in order to bring the potential of the bit line to a predetermined charge potential prior to each read-out operation. This serves for attaining a defined state on the bit line, so that a change in charge on the bit line can be reliably detected.

Furthermore, provision may be made of a first voltage source for providing the first potential and a second voltage source for providing the second potential, the first and second potentials having different signs with regard to the predetermined potential of the bit line. This is used to the effect that the electrical quantities brought about by the reference resistance cell and the CBRAM resistance memory cell are subtracted from one another, so that the memory datum to be read out can be determined in a simple manner on the basis of the difference in the charge potential on the bit line.

Preferably, the magnitudes of the first potential and of the second potential and also the predetermined time duration of the activation of the reference switch and the predetermined time duration of the activation of the selection switch in the read-out unit are chosen such that, assuming that the resistance of the CBRAM memory element corresponds to the resistance threshold value, the charges flowing onto and from the bit line are equalized, with the result that there is no change in the potential of the bit line. In this way, on the basis of the sign of the potential situated on the bit line after the activation of the selection switch and of the reference selection switch, the memory datum stored in the memory cell can be determined and output.

A further aspect of the present invention provides a method for evaluating a memory datum in a CBRAM resistance memory cell arranged on a bit line. The CBRAM resistance memory cell has a CBRAM resistance element, which can be connected to the bit line and the resistance of which can be set by means of a write current, in order to store an item of information. The method comprises the steps of connecting a first potential to the bit line via the CBRAM resistance element, connecting a second potential to the bit line via a reference resistance element, ascertaining a resulting electrical quantity assigned to the bit line, and outputting the memory datum to be read out in a manner dependent on the resulting electrical quantity.

This method has the advantage that both reference resistance elements and CBRAM resistance elements can be directly connected to the bit line, with the result that it is possible to avoid an additional outlay on circuitry for providing an electrical quantity serving as reference value for the evaluation of the CBRAM resistance element. Moreover, inaccuracies that occur can be avoided since the same evaluation unit connected to the same bit line is used for the read-out of the reference resistance cell.

Preferably, a resulting current onto the bit line is ascertained as the resulting electrical quantity if the potential of the bit line is kept constant, and the memory datum to be read out being output in a manner dependent on the resulting current.

As an alternative, the connection of the first potential to the bit line via the CBRAM resistance element may be carried out during a first predetermined time duration, and the connection of the second potential to the bit line via the reference resistance element may be carried out during a second predetermined time duration, whereby the bit line is charged with a resulting charge. The memory datum is then output in a manner dependent on the resulting charge on the bit line.

In the case of this alternative, the magnitudes of the first potential and of the second potential and also the first and second predetermined time durations are preferably chosen such that, assuming that the resistance value of the CBRAM resistance element corresponds to a resistance threshold value of the reference resistance element, the charges flowing onto and from the bit line are essentially equalized, with the result that there is no change in potential on the bit line during read-out or after the read-out operation.

In a further embodiment of the present invention, the read-out unit may be configured such that the reference selection switch and the selection switch are activated simultaneously, so that a first or second charge potential is adopted on the bit line depending on the resistance of the CBRAM resistance element and the resistance of the reference resistance element, the evaluation unit outputting the memory datum in a manner dependent on the resulting charge potential. In this way, it is possible, primarily in comparison with the previous embodiment, to dispense with a time control of the application of the activation signals. The respective currents through the CBRAM resistance element and through the reference resistance element essentially charge or discharge the bit line, so that either a first or a second charge potential is attained on the bit line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
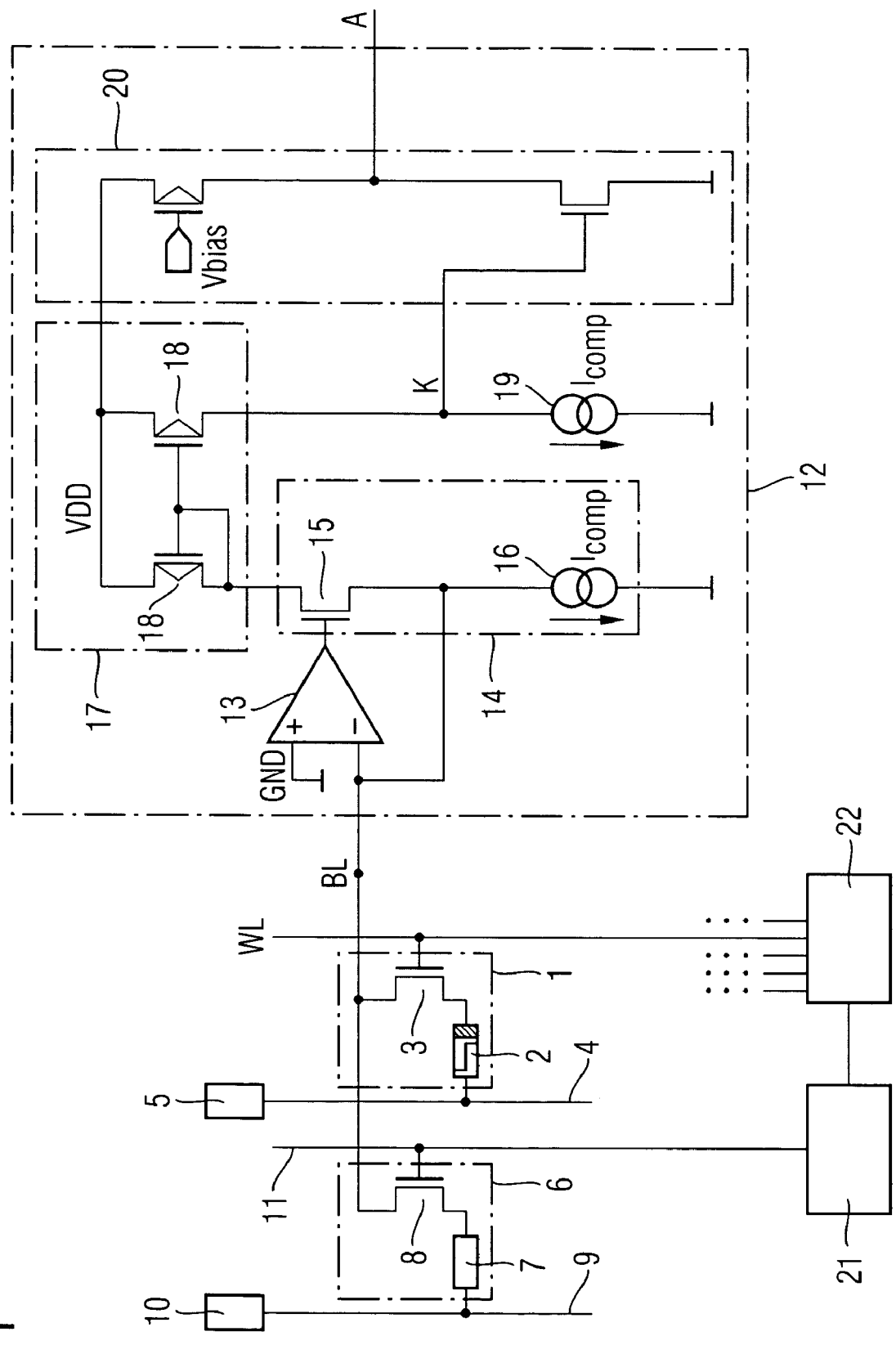
FIG. 1 shows a circuit diagram of a memory circuit in accordance with a first embodiment of the invention.

FIG. 1 illustrates a circuit diagram of a detail from a memory circuit. The detail from the memory circuit shows a word line WL and a bit line BL, which essentially run perpendicular to one another and at the crossover point of which a CBRAM resistance memory cell 1 is arranged. The CBRAM resistance memory cell represents, by way of example, a multiplicity of cells in a matrix formed from word lines WL and bit lines BL. The CBRAM resistance memory cell 1 has a CBRAM resistance element 2 and a selection switch 3. The CBRAM resistance element 2 is connected by a first terminal to a read voltage source 5 via a read voltage line 4. A second terminal of the CBRAM resistance element 2 is connected to a first terminal of a selection transistor 3, and a second terminal of the selection transistor 3 is connected to the bit line BL. A control terminal of the selection transistor 3 is connected to the word line WL, so that the selection transistor 3 can be opened or closed by an activation signal on the word line WL.

The CBRAM resistance element 2 is essentially constructed with a solid electrolyte situated between two electrodes. Through suitable application of a programming current, it is thus possible to form or withdraw conductive paths in the solid electrolyte and thus to set the resistance of the CBRAM resistance element 2 by means of previous programming with a programming current. In this way, it is possible to set the resistance of the resistance element in different resistance ranges corresponding to different states of the CBRAM resistance element, and thereby to store an item of information as a memory datum. Instead of the CBRAM resistance element, it is also possible to provide other programmable resistance elements whose resistance value can be programmed by application of a current or in some other way.

A CBRAM resistance memory cell 1 formed with such a CBRAM resistance element 2 is read essentially by measuring the associated resistance or by generating an electrical quantity dependent on the electrical resistance of the CBRAM resistance element. Said electrical quantity is compared with an electrical reference quantity or evaluated in a manner dependent on the electrical reference quantity in order thus to determine the memory datum defined by the electrical quantity read out.

A reference resistance cell 6 is provided for this purpose, said reference resistance cell having a reference resistance element 7 and a reference selection switch 8. The reference resistance cell 6 is arranged on the same bit line as the CBRAM resistance memory cell 1. In a memory matrix having a plurality of bit lines and a plurality of word lines, such a reference resistance cell is preferably provided on each of the bit lines. The reference selection transistor 8 is connected by a first terminal to the bit line BL and by a second terminal to a first terminal of the reference resistance element 7. A second terminal of the reference resistance element 7 is connected to a reference voltage source 10 via a reference voltage line 9. A control terminal of the reference selection transistor 8 is connected to a reference line 11, so that the reference selection transistor 8 can be turned on or turned off in a manner dependent on a signal on the reference line 11.

The bit line BL is connected to an evaluation unit 12, which, in the event of the read-out of the relevant CBRAM resistance memory cell 1, evaluates a current flowing from or onto the bit line BL and assigns it to a memory datum. The corresponding memory datum is output with the aid of a logic level at an output A of the evaluation unit 12.

The evaluation unit 12 has an operational amplifier 13, the inverting input of which is connected to the bit line BL. The noninverting input of the operational amplifier 13 is connected to a fixed potential, preferably a ground potential GND. An output of the operational amplifier 13 is connected to a source follower circuit 14 having an n-channel field effect transistor 15 and a current source 16. A control terminal of the n-channel transistor 15 is connected to the output of the operational amplifier 13, and a first terminal of the n-channel field effect transistor 15 is both connected to the current source 16 and coupled with feedback to the bit line BL. The n-channel transistor 15 and the current source 16 are thus connected in series and form a current path of a current mirror 17 constructed with the aid of p-channel transistors 18. The current through the source follower circuit 14 is mirrored into a further current branch, which has a further current source 19, by the current mirror circuit 17. A node K is arranged between the series-connected current mirror circuit 17 and the further current source 19, it being possible for the output signal to be tapped off at said node. For this purpose, the node K is connected to an inverter stage 20 having a p-channel transistor and an n-channel transistor, which inverter stage inverts the signal present at the node K, amplifies it to the logic level and drives it onto the output A of the evaluation unit 12. The p-channel transistor is driven with a defined drive voltage $V_{Bias}$ in order to set a specific pull-up resistance.

The source following circuit 14 connected to the output of the operational amplifier 13 serves as a negative feedback circuit since it amplifies the signal at the output of the operational amplifier and applies it to the inverting input of the operational amplifier 13. As a result, a voltage difference between the noninverting input and the inverting input of the operational amplifier 13 is negatively amplified, so that the bit line is held at a potential determined by the defined potential applied to the noninverting input of the operational amplifier 13, a ground potential in the example illustrated. By virtue of the fact that the bit line is held at the defined potential during the read operation, it is thus possible, given a known read voltage generated by the read voltage source 5 and a known reference voltage generated by the reference voltage source 10, and also given a known resistance value of the reference resistance element, to carry out an evaluation of the state or the resistance value of the CBRAM resistance memory cell 1 to be read.

The current source 16 is required since, in the case of negative currents, the voltage regulation of the bit line with the aid of the source follower circuit does not function since the transistor at the output of the operational amplifier can operate only as a current source but not as a current sink.

The read-out is controlled with the aid of a read-out unit 21, which is connected to an address decoder 22, which activates the respective word line for the addressed CBRAM resistance memory cell 1 in a manner dependent on a predetermined address in a known way. In the event of the read-out of a memory cell, the read-out unit 21 activates the reference line 11 and instructs the address decoder 22 to activate the correspondingly addressed word line WL, so that the reference selection transistor 8 and the selection transistor 3 are essentially turned on simultaneously, so that both the reference voltage across the reference resistance element 7 and the read-out voltage across the CBRAM resistance element 2 to be read are applied to the bit line BL. The predetermined potential at the noninverting input of the operational amplifier 13, which corresponds to the potential at which the bit line BL is intended to be kept constant, is preferably different from the reference voltage and the read voltage. In order to be able to perform an optimum assessment of the state stored in the CBRAM resistance element 2, the reference voltage and the read voltage preferably exhibit different signs and are preferably, but not necessarily, of identical magnitude.

The resistance value of the reference resistance element 7 is preferably chosen such that it lies between the resistance values of the resistance values representing different states of the CBRAM resistance memory cell and thus forms a resistance threshold value. By way of example, such a reference resistance element may be formed by one or more CBRAM resistance elements set in a suitable manner. By way of example, the resistance threshold value of the reference resistance element may be formed by connecting in parallel two CBRAM resistance elements which are set to the resistance value corresponding to the higher resistance value of the possible states of the CBRAM resistance elements. Since the separation between the resistance values in the case of different states of the CBRAM resistance element usually encompasses two or more orders of magnitude, it is thus possible to form a resistance threshold value for the reference resistance element which lies between a low resistance value for a first state and a high resistance value for a second state of the CBRAM resistance element.

The resistance threshold value should ideally be chosen such that the magnitudes of the current flows onto and from the bit line are essentially identical for two different states.

Figure 2:
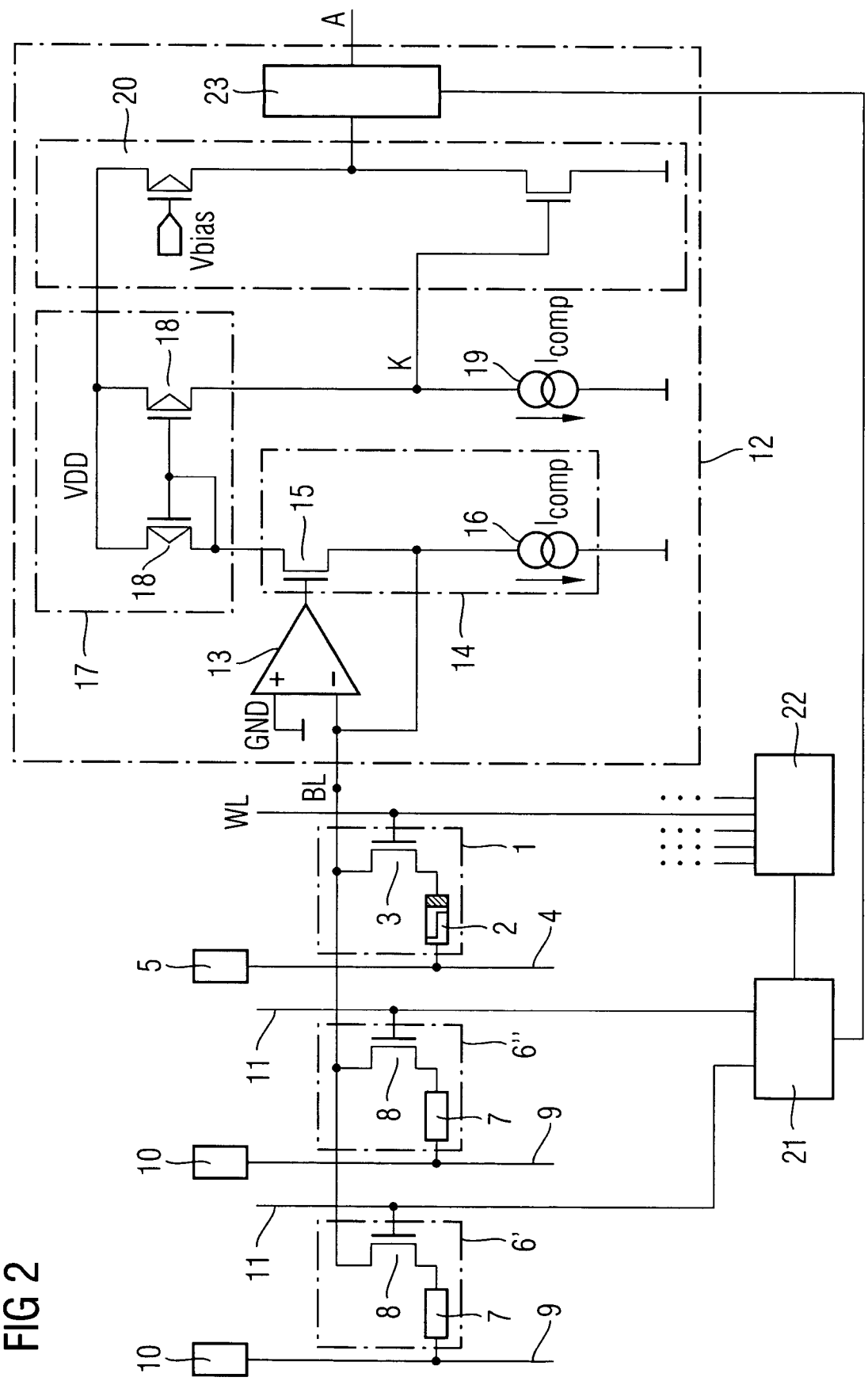
FIG. 2 shows a circuit diagram of a memory circuit in accordance with a second embodiment of the invention.

FIG. 2 illustrates a further embodiment of the invention, which essentially differs from the embodiment in FIG. 1 by virtue of the fact that a plurality of reference resistance cells 6', 6" are provided on the bit line BL, which in each case define a different resistance threshold value, so that more than two states of the CBRAM resistance elements 2 can be detected depending on the number of the plurality of reference resistance elements 6', 6". For this purpose, the read-out unit 21 is connected to the reference resistance cells 6', 6" via a plurality of reference lines, respectively, and successively activates said reference resistance cells in the event of the read-out of the CBRAM resistance memory cell 1, and thus obtains evaluations of the state of the CBRAM resistance of the memory cell 1 with regard to different resistance threshold values set in the reference resistance elements 6.

Furthermore, the evaluation unit 12 has a shift register 23, which is coupled to the node K and to which the successively determined evaluation results are written. Depending on the content of the shift register 23, one output datum or a plurality of output data are then generated, or the contents of the shift register 23 are output directly in parallel or serially. In order to control the writing of the evaluation results to the shift register 23, the shift register 23 is likewise connected to the read-out unit 21, so that, with each activation of one of the reference resistance cells 6', 6", an assigned corresponding position of the shift register 23 is activated for the writing of the corresponding evaluation result.

Figure 3:
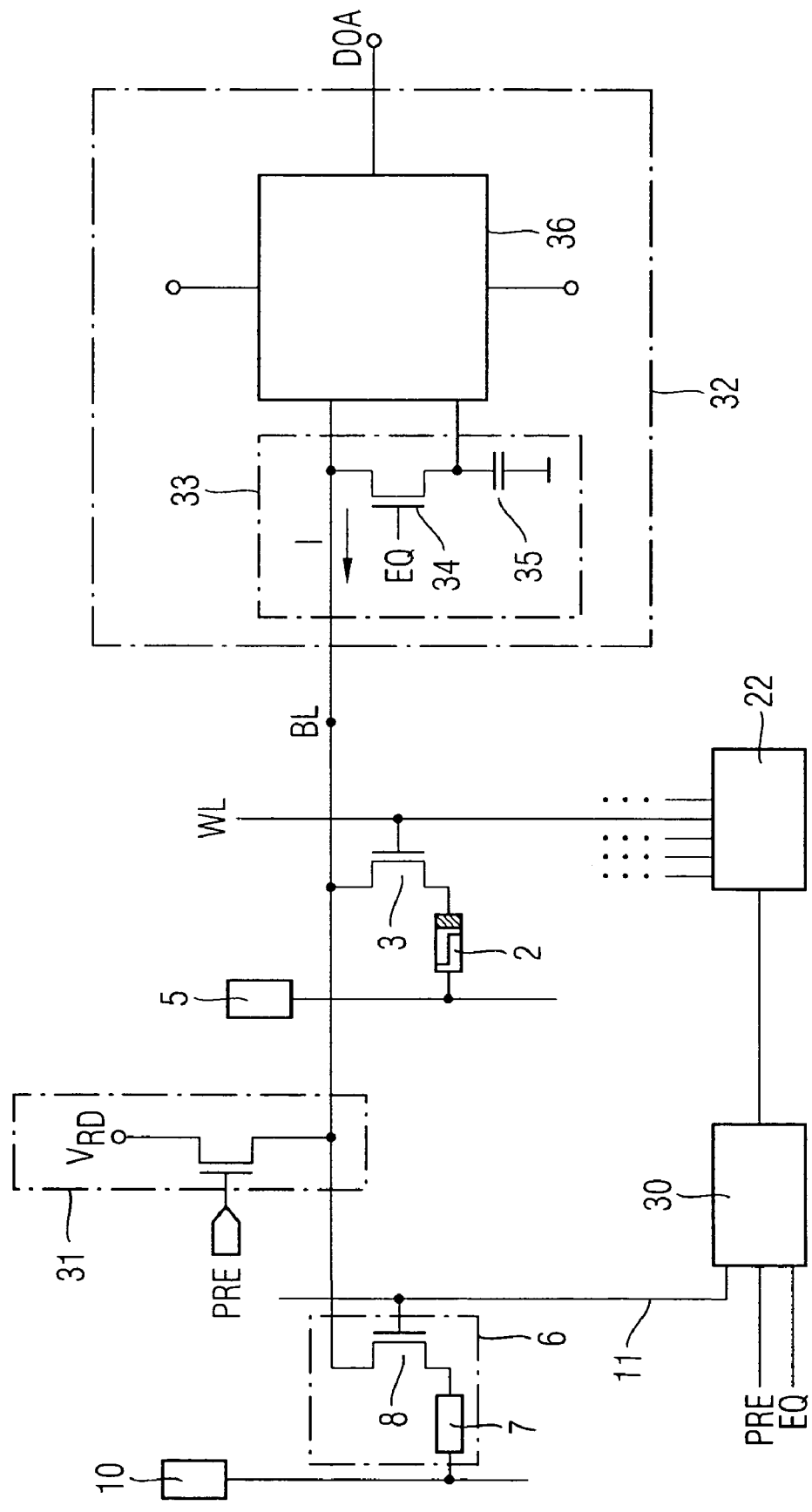
FIG. 3 shows a circuit diagram of a memory circuit in accordance with a third embodiment of the invention.

FIG. 3 illustrates a circuit diagram of a further embodiment of the invention. In FIG. 3, identical reference symbols designate identical or similar elements of identical function with respect to those in the embodiments of FIGS. 1 and 2. In the same way as in the previous embodiments, the reference resistance cell and the CBRAM resistance memory cell 1 are arranged on a common bit line BL. As in the previous embodiments, the word line for the CBRAM resistance memory cell 1 is connected to an address decoder 22 in order to address the corresponding CBRAM resistance memory cell in a manner dependent on an applied address. A read-out unit 30 is provided, which is connected to the address decoder 22, and which is connected to the reference resistance cell 6 via the reference word line 11.

Furthermore, a precharge circuit 31 is provided, which, under the control of the read-out unit 30, applies a defined precharge potential $V_{RD}$ to the bit line in order to prevent an undefined charge potential on the bit line, so that a reliable evaluation can be carried out.

A reference potential circuit 33 is furthermore provided, which has an n-channel field effect transistor 34 and a storage capacitance 35. When the bit line BL is precharged by the precharge circuit 31, the n-channel field effect transistor 34 is likewise turned on in order to bring the storage capacitance 35 to a specific potential. The evaluation unit 32 comprises a sense amplifier 36 such as is known from DRAM circuits, for example, which essentially detects and amplifies a small difference in charge between bit lines or between a bit line and a charge store. A comprehensive description of the functioning of such a sense amplifier is not discussed below.

For the purpose of reading out the memory datum which is stored in the CBRAM resistance memory cell 1, firstly the read-out unit 30 activates the precharge unit 31 and the reference potential circuit 33, so that the bit line BL and the storage capacitance 35 are put at a defined potential. After the deactivation of the precharge unit 31 and of the reference potential circuit 33, the addressed word line WL and the reference line 11 are activated, so that the read voltage source 5 and the reference voltage source 10 are connected to the bit line BL via the CBRAM resistance element 2 of the CBRAM resistance memory cell 1 to be read and the reference resistance element 7, respectively. The activation of the word line WL and of the reference word line 11 is effected for predetermined time durations in which charges from the read voltage source 5 and the reference voltage source 10 flow from or onto the bit line BL, it being possible for the time durations to be identical or different. The precharge potential $V_{RD}$ to which the bit line has been charged is then altered depending on charges flowing via the CBRAM resistance element 2 and the reference resistance element 7 and evaluated by the sense amplifier 36 with regard to the charge potential stored in the storage capacitance 35.

The read voltage of the read voltage source 5 and the reference voltage of the reference voltage source 10 preferably have different signs with regard to the precharge potential $V_{RD}$, with the result that the charge on the bit line has changed after the read-out operation depending on the amount of the charges flowing onto the bit line via the CBRAM resistance element 2 and the reference resistance element 7. Depending on what resistance value the CBRAM resistance element 2 has in a manner dependent on the stored memory datum, on the bit line there is then either an increased or decreased potential with respect to the precharge potential $V_{RD}$. This change in potential can be detected by the evaluation unit 32 and be converted into an output signal A.

The activation of the CBRAM resistance memory cell 1 and of the reference resistance cell 6 may be effected simultaneously or successively. However, a successive activation should preferably be carried out in direct succession. It has the advantage that in the event of read-out the loading on the supply voltage sources can be distributed temporally, with the result that a more uniform load of the voltage sources can be attained, which leads to reduced voltage fluctuations on the supply lines and thus to fewer interference influences.

The resistance threshold value of the reference resistance element 7, the time duration for which the reference selection transistor is activated and the time duration for which the selection transistor 3 is activated are preferably set such that, in the case of an ideal CBRAM resistance element 2, the magnitude of the change in charge is identical for each state of the CBRAM resistance element 2 but has different signs for different states. This has the advantage that the sense amplifier can be dimensioned in a simple manner. In the case of identical time durations, it is advantageous to set the resistance threshold value of the reference resistance element 7 to a resistance value which corresponds to double the resistance value of the state of the CBRAM resistance element 2 in which the latter has the low resistance value.

Instead of providing the temporally controlled connection of the CBRAM resistance memory cell 1 and of the reference resistance cell 6, these may be simultaneously connected to the bit line, so that a current that charges the bit line and a current that discharges the bit line flow simultaneously. The difference between the two currents causes the bit line to be charged to a first or second charge potential, which can be evaluated by the evaluation unit. In this case, the first and second charge potentials have different signs.

The illustrated embodiments of the invention have the advantage that the outlay on circuitry for providing an electrical comparison quantity for evaluating the determined electrical quantity that is dependent on the state of the CBRAM resistance element of the CBRAM resistance memory cell 1 can be reduced since both the reference resistance cell and the CBRAM resistance memory cell are arranged on a common bit line. The resistance value of the CBRAM resistance element of the CBRAM resistance memory cell and the resistance threshold value of the reference resistance element are subtracted from one another and thus evaluated as early as on the bit line. By virtue of avoiding the additional circuit for generating the electrical comparison quantity, mismatching problems between the read path and the reference path are furthermore avoided and the influences on account of parameter fluctuations of the electronic circuits are avoided.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
   a CBRAM resistance memory cell connected to a bit line and a word line; the CBRAM resistance memory cell comprising (i) a CBRAM resistance element, the resistance of which is set by a write current for storing an item of information and (ii) a selection switch, driven via the word line, to connect a first potential to the bit line via the CBRAM resistance element;
   a reference resistance cell connected to the bit line and to a reference line; the reference resistance cell comprising (i) a reference resistance element having a resistance set to a resistance threshold value and (ii) a reference selection switch, driven via the reference line, to connect a second potential to the bit line via the reference resistance element;
   a read-out unit configured to activate the reference selection switch and the selection switch such that a memory cell current is established between the CBRAM resistance memory cell and the bit line and a reference current is established between the reference resistance cell and the bit line, whereby a memory datum is read out of the CBRAM resistance memory cell; and
   an evaluation unit, connected to the bit line, configured to output the memory datum based on a resulting electrical quantity evaluated from the bit line.

2. The memory circuit of claim 1, wherein, for a potential that is kept constant on the bit line with the reference selection switch activated and the selection switch active, the evaluation unit is configured to receive a current resulting from the memory cell current and the reference current and to output the memory datum based on a resulting voltage evaluated from the bit line.

3. The memory circuit of claim 2, wherein the evaluation unit comprises:
   an operational amplifier having an input connected to the bit line; and
   a negative feedback circuit provided to keep the potential on the bit line constant at a predetermined potential value.

4. The memory circuit of claim 3, further comprising:
   a first voltage source for providing the first potential; and
   a second voltage source for providing the second potential, wherein the first potential and the second potential have different signs with regard to the predetermined potential value of the bit line.

5. The memory circuit of claim 1, further comprising a plurality of reference resistance cells connected to the bit line and having different resistance threshold values,
   wherein the read-out unit, in the event of read-out, successively activates a respective one of the reference resistance cells, and
   wherein the evaluation unit outputs the respective memory datum based on respective resulting currents evaluated from the bit line.

6. The memory circuit of claim 1, wherein the read-out unit is configured to activate the reference selection switch and selection switch, at least one of successively and simultaneously for a predetermined time duration, such that after the deactivation of the reference selection switch and of the selection switch, a resulting charge, which depends on the resistance of the CBRAM resistance element and the resistance of the reference resistance element, is provided on the bit line, and wherein the evaluation unit outputs the memory datum based on the resulting charge.

7. The memory circuit of claim 6, further comprising:
a charge equalizing unit connected to the bit line to bring the potential of the bit line to a predetermined potential prior to each read-out operation.

8. The memory circuit of claim 7, further comprising:
a first voltage source for providing the first potential; and
a second voltage source for providing the second potential, wherein the first potential and the second potential have different signs with regard to the predetermined potential of the bit line.

9. The memory circuit of claim 8, wherein magnitudes of the first potential and of the second potential, the predetermined time duration of the activation of the reference switch and the predetermined time duration of the activation of the selection switch in the read-out unit are chosen such that, when the resistance of the CBRAM memory element corresponds to the resistance threshold value, the charges flowing onto and from the bit line are equalized, resulting in no change in the potential of the bit line.

10. The memory circuit of claim 1, wherein the read-out unit is configured to activate the reference selection switch and the selection switch simultaneously, such that a resulting charge potential, which is one of a first charge potential and a second charge potential, is attained on the bit line depending on the resistance value of the CBRAM resistance element and the resistance value of the reference resistance element, and wherein the evaluation unit outputs the memory datum based on the resulting charge potential.

11. A method for evaluating a memory datum in a CBRAM resistance memory cell having a CBRAM resistance element connected to a bit line, comprising:
connecting a first potential to the bit line via the CBRAM resistance element, wherein the CBRAM resistance element having a resistance set by a write current to store an item of information;
selectively connecting a second potential to the bit line via a reference resistance element;
ascertaining a resulting electrical quantity on the bit line; and
outputting a memory datum based on the resulting electrical quantity.

12. The method of claim 11, wherein a resulting current onto the bit line is ascertained as the resulting electrical quantity when a potential of the bit line is kept constant, and wherein the memory datum read out is output based on the resulting current.

13. The method of claim 11, wherein a resistance of the reference resistance element is set to a resistance threshold value.

14. The method of claim 11, wherein the first potential to the bit line via the CBRAM resistance element is applied for a first predetermined time duration and the second potential to the bit line via the reference resistance element is applied for a second predetermined time duration, wherein the bit line is charged with a resulting charge, and wherein the memory datum is output based on the resulting charge.

15. The method of claim 14, wherein magnitudes of the first potential and of the second potential and the first and second predetermined time durations are chosen such that, when the resistance value of the CBRAM resistance element corresponds to a resistance threshold value of the reference resistance, the charges flowing onto and from the bit line are equalized, resulting in no change in potential on the bit line.

16. A memory circuit, comprising:
a programmable memory cell connected to a wordline and a bitline, the programmable resistance cell comprising:
a programmable resistance element having a resistance programmable by a write current for storing an item of information; and
a selection switch, driven via the word line, to connect a first potential to the bit line via the programmable resistance element;
a reference resistance cell connected to the bit line and to a reference line, the reference resistance cell comprising:
a reference resistance element having a resistance set to a resistance threshold value; and
a reference selection switch, driven via the reference line, to connect a second potential to the bit line via the reference resistance element;
a read-out unit configured to selectively activate the reference selection switch and the selection switch for reading out a memory datum, wherein, with the switches activated, a memory cell current and a reference current flow onto the bit line; and
an evaluation unit, connected to the bit line, configured to output the memory datum based on a resulting electrical quantity evaluated from the bit line.

17. The memory circuit of claim 16, further comprising one or more further reference resistance cells connected to the bit line and to the reference line, each additional reference resistance cell comprising:
a respective further reference resistance element having a respective further resistance set to a respective further resistance threshold value; and
a respective further reference selection switch, driven via the reference line, to connect a respective further potential to the bit line.

18. The memory circuit of claim 17, wherein the evaluation unit further comprises a shift register connected to the read-out unit, wherein successively determined evaluation results are written to the shift register corresponding to successive activations of the respective reference resistance cell and the one or more further reference resistance cells, and wherein contents of the shift register are output in one of a parallel mode and a serial mode.

19. The memory circuit of claim 16, further comprising:
a precharge circuit, connected to and controlled by the read-out unit, for applying a defined precharge potential to the bit line for each read-out operation.

20. The memory circuit of claim 19, wherein the evaluation unit comprises:
a reference potential circuit comprising a field effect transistor and a storage capacitance, wherein, when the bit line is precharged by the precharge circuit, the field effect transistor is turned on to bring the storage capacitance to a specific potential; and a sense amplifier for detecting a charge difference between the bit line and the specific potential and providing the memory datum based on the detected charge difference.

21. The method of claim 13, wherein the resistance threshold value lies between resistance values representing different states of the CBRAM resistance memory cell.

22. The method of claim 11, wherein the second potential is switchably connected to the bit line via a reference selection switch and the reference resistance element.

* * * * *

UNITED STATES PATENT AND TRADEMARK OFFICE
CERTIFICATE OF CORRECTION

| | | |
|---|---|---|
| PATENT NO. | : 7,254,052 B2 | Page 1 of 1 |
| APPLICATION NO. | : 11/287501 | |
| DATED | : August 7, 2007 | |
| INVENTOR(S) | : Corvin Liaw | |

It is certified that error appears in the above-identified patent and that said Letters Patent is hereby corrected as shown below:

On the Title Page

Please insert Item --(30)      Foreign Application Priority Data

November 25, 2004   (DE) ............10 2004 056 911--.

Signed and Sealed this

Twelfth Day of August, 2008

JON W. DUDAS
*Director of the United States Patent and Trademark Office*